(12) United States Patent
Hsu et al.

(10) Patent No.: US 8,988,092 B2
(45) Date of Patent: Mar. 24, 2015

(54) PROBING APPARATUS FOR SEMICONDUCTOR DEVICES

(75) Inventors: Chen Jung Hsu, Hsinchu (TW); Chao Cheng Tseng, Hsinchu (TW)

(73) Assignee: Star Technologies Inc., Hsinchu (TW)

( * ) Notice: Subject to any disclaimer, the term of this patent is extended or adjusted under 35 U.S.C. 154(b) by 687 days.

(21) Appl. No.: 13/305,028

(22) Filed: Nov. 28, 2011

(65) Prior Publication Data

US 2013/0027072 A1 Jan. 31, 2013

(30) Foreign Application Priority Data

Jul. 28, 2011 (TW) .............................. 100126726 A

(51) Int. Cl.
| | | |
|---|---|---|
| *G01R 1/067* | (2006.01) | |
| *G01R 31/20* | (2006.01) | |
| *G01R 31/00* | (2006.01) | |
| *G01R 31/28* | (2006.01) | |
| *G01R 1/073* | (2006.01) | |

(52) U.S. Cl.
CPC ........ *G01R 31/2889* (2013.01); *G01R 31/2886* (2013.01); *G01R 31/2887* (2013.01); *G01R 1/07342* (2013.01); *G01R 1/07378* (2013.01)
USPC ............... 324/755.01; 324/754.2; 324/754.01

(58) Field of Classification Search
USPC .......... 324/755.01, 537, 500, 754.01, 754.03, 324/754.07, 754.1, 754.11, 755.11, 756.03, 324/690, 696, 715, 724, 72.5
See application file for complete search history.

(56) References Cited

U.S. PATENT DOCUMENTS

| | | | |
|---|---|---|---|
| 4,757,256 A * | 7/1988 | Whann et al. ............ | 324/750.25 |
| 6,839,964 B2 | 1/2005 | Henson | |
| 6,967,557 B2 | 11/2005 | Hagios et al. | |
| 7,196,531 B2 | 3/2007 | Grube et al. | |
| 2002/0145437 A1 | 10/2002 | Sporck et al. | |
| 2007/0261009 A1* | 11/2007 | Granicher et al. ................. | 716/1 |
| 2008/0100320 A1* | 5/2008 | Miller et al. .................. | 324/754 |

FOREIGN PATENT DOCUMENTS

| | | |
|---|---|---|
| TW | 201042266 | 12/2010 |
| TW | 201100811 | 1/2011 |
| WO | 9602845 A1 | 2/1996 |

OTHER PUBLICATIONS

Office Action dated Sep. 24, 2013 from Taiwan counterpart application 100126726.
English abstract translation of the office action dated Sep. 24, 2013 from Taiwan counterpart application 100126726.
Abstract Translation of TW 201042266.
Abstract Translation of TW 201100811.

* cited by examiner

*Primary Examiner* — Hoai-An D Nguyen
(74) *Attorney, Agent, or Firm* — WPAT, P.C.; Anthony King; Kay Yang

(57) ABSTRACT

A probing apparatus for semiconductor devices provides a primary circuit board and a signal-adapting board positioned on the primary circuit board. The primary circuit board includes an inner area having a plurality of first contacts and an outer area having a plurality of first terminals and second terminals, and the first contacts are electrically connected to the first terminals via first conductive members in the primary circuit board. The signal-adapting board includes a plurality of second contacts electrically connected to the first contacts via second conductive members in the signal-adapting board.

26 Claims, 18 Drawing Sheets

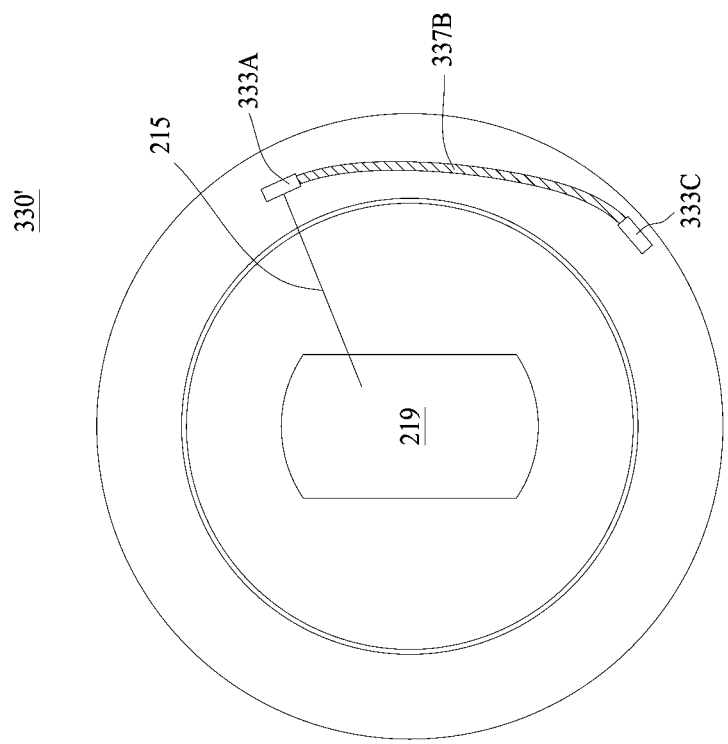

PROBING APPARATUS FOR SEMICONDUCTOR DEVICES

BACKGROUND OF THE INVENTION

1. Technical Field

The present invention relates to a probing apparatus for semiconductor devices, and more particularly, to a probing apparatus for semiconductor devices including a primary circuit board and an auxiliary circuit board such as a power board or a signal-adapting board.

2. Background

Generally, it is necessary to test the electrical characteristics of semiconductor devices such as integrated circuit devices at the wafer level to check whether the integrated circuit device meets the product specifications. Integrated circuit devices with electrical characteristics meeting the specifications are selected for the subsequent packaging process, while other devices are discarded to avoid additional packaging cost. Another electrical property test is performed on the integrated circuit device after the packaging process is completed, so as to screen out substandard devices and increase product quality.

There are two major types of probes according to the prior art, i.e., the cantilever probe and the vertical probe. The cantilever probe provides appropriate vertical displacement when the probe tip contacts an integrated circuit device under test via a cantilever contact structure designed to prevent the integrated circuit device under test from being exposed to excessive probe pressure applied by the probe tip. In contrast, the vertical probe offers the vertical displacement required by the probe tip to contact the integrated circuit device under test using the deformation of the probe body itself.

The vertical probes can be arranged in a fine pitch manner corresponding to the contacts of the integrated circuit devices under test with high-density of pin; however, the wiring space of the printed circuit board is much larger than the contact space of the vertical probes. U.S. Pat. No. 6,967,557 discloses a spacer transformer for probe cards with vertical probes, and the space transformer is configured to transform the spacing of chip contacts with respect to an integrated circuit chip to a larger spacing that will accommodate printed circuit board (PCB) wiring and/or conventional wires.

FIG. 1 illustrates a top view of a conventional probe card 10 with cantilever probes 15. FIG. 2 illustrates the inner traces of the probe card 10. Referring to FIG. 1, the probe card 10 includes a plurality of power contacts 23 positioned in a power ring area 21, a plurality of signal contacts 33 positioned in a signal ring area 31, and a plurality of terminals 43 positioned in an outer ring area 41, wherein the power ring area 21 is closer to the center 11 than the signal ring area 31. The terminals 43 are electrically connected to contacts at the other side of the probe card 10 to form electrical connection with pins of a tester (not shown in the drawings), and the probe card 10 is further equipped with a plurality of probes 15 with a tip portion for contacting a device under test (not shown in the drawings) through an opening 13 and a distal end connected to the signal contacts 33. The signal contacts 33 are electrically connected to the terminals 43 via the internal traces 35, as shown in FIG. 2. The probes 15 must span the power ring area 21 to connect the signal contacts 33 in the signal ring area 31, but the spanning of the probes 15 increases the length of the probes 15, which generates the signal loss problem.

FIG. 3 illustrates a top view of a conventional probe card 100, and FIG. 4 illustrates the inner traces of the probe card 100 with cantilever probes 115. Referring to FIG. 3, the probe card 100 includes a plurality of power contacts 123 positioned in a power ring area 121, a plurality of signal contacts 133 positioned in a signal ring area 131, and a plurality of terminals 143 positioned in an outer ring area 141, wherein the signal ring area 121 is closer to the center 111 than the power ring area 131. The terminals 143 are electrically connected to contacts at the other side of the probe card 100 to form electrical connections with pins of a tester (not shown in the drawings), and the probe card 10 is further equipped with a plurality of probes 115 with a tip portion for contacting a device under test through an opening 113 and a distal end connected to the signal contacts 133. The signal contacts 133 are electrically connected to the terminals 143 via the internal traces 135 as shown in FIG. 4.

The probes 115 directly connect the signal contacts 133 in the signal ring area 31 without spanning the power ring area 121, and the signal loss can be substantially decreased. However, to electrically connect the signal contacts 133 in the signal ring area 131 and the terminals 143 in the outer ring area 141 without intersecting the power contacts 123 between the signal ring area 131 and the outer ring area 141, the internal traces 135 must pass through the power ring area 121 and have several turns to bypass the power contacts 123. Consequently, the length of the internal traces 135 is increased, which leads to the signal loss problem. In addition, the internal traces 135 carrying the signals are very close to the power contact 123, and the voltage of the power contact 123 may influence the signals on the internal traces 135, causing signal disturbance.

SUMMARY

A probing apparatus for semiconductor devices including a primary circuit board and an auxiliary circuit board such as a power board or a signal-adapting board.

In one embodiment of the present invention, a probing apparatus for semiconductor devices comprises a primary circuit board and a signal-adapting board positioned on the primary circuit board; the primary circuit board includes an inner area having a plurality of first contacts and an outer area having a plurality of first terminals and second terminals, and the first contacts are electrically connected to the first terminals via first conductive members in the primary circuit board; and the signal-adapting board includes a plurality of second contacts electrically connected to the first contacts via second conductive members in the signal-adapting board.

By positioning the power contact and the signal contact on different circuit boards, the signal probe can connect the signal contacts in the inner area without spanning the intermediate area where the power board is located, and the signal loss problem caused by the spanning of the probe can be substantially solved. In addition, the conductive through holes for transmitting power are concentrated in a predetermined area on the primary circuit board, and the internal traces for transmitting signals can be more easily designed without concern for the position of the conductive through holes for transmitting power, and the internal traces for transmitting signals can be substantially linear, without turns to bypass the power contacts. Consequently, the internal traces carrying the signals are not close to the conductive through holes for transmitting power, and the voltage of the conductive through holes for transmitting power may not influence the signals on the internal traces, i.e., signal disturbance is eliminated.

In one embodiment of the present invention, a probing apparatus comprises a primary circuit board and a power board positioned on the primary circuit board; a primary circuit board includes an inner area having a plurality of first contacts and an outer area having a plurality of first terminals and second terminals, and the first contacts are electrically connected to the first terminals via first conductive members in the primary circuit board; and the power board includes a plurality of second contacts electrically connected to the second terminals via at least second conductive members in the primary circuit board.

By using the signal-adapting board, the primary circuit board can be commonly used for different probe arrangements. In case that the signal probe is designed to form electrically connection with different signal terminals, the designer does not need to rearrange the signal probe or to change the primary circuit board; instead, the designer only have to use another signal-adapting board having second conductive members electrically connecting one of the contact on the signal-adapting board to the other contact, whose position corresponds to the position of one of the first contacts on the primary circuit board electrically connected to the desired signal terminals.

The foregoing has outlined rather broadly the features and technical advantages of the present invention in order that the detailed description of the invention that follows may be better understood. Additional features and advantages of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention are illustrated with the following description and upon reference to the accompanying drawings in which:

FIG. 18 illustrates the function of the signal-adapting board according to one embodiment of the present invention.

DETAILED DESCRIPTION

Figure 1:
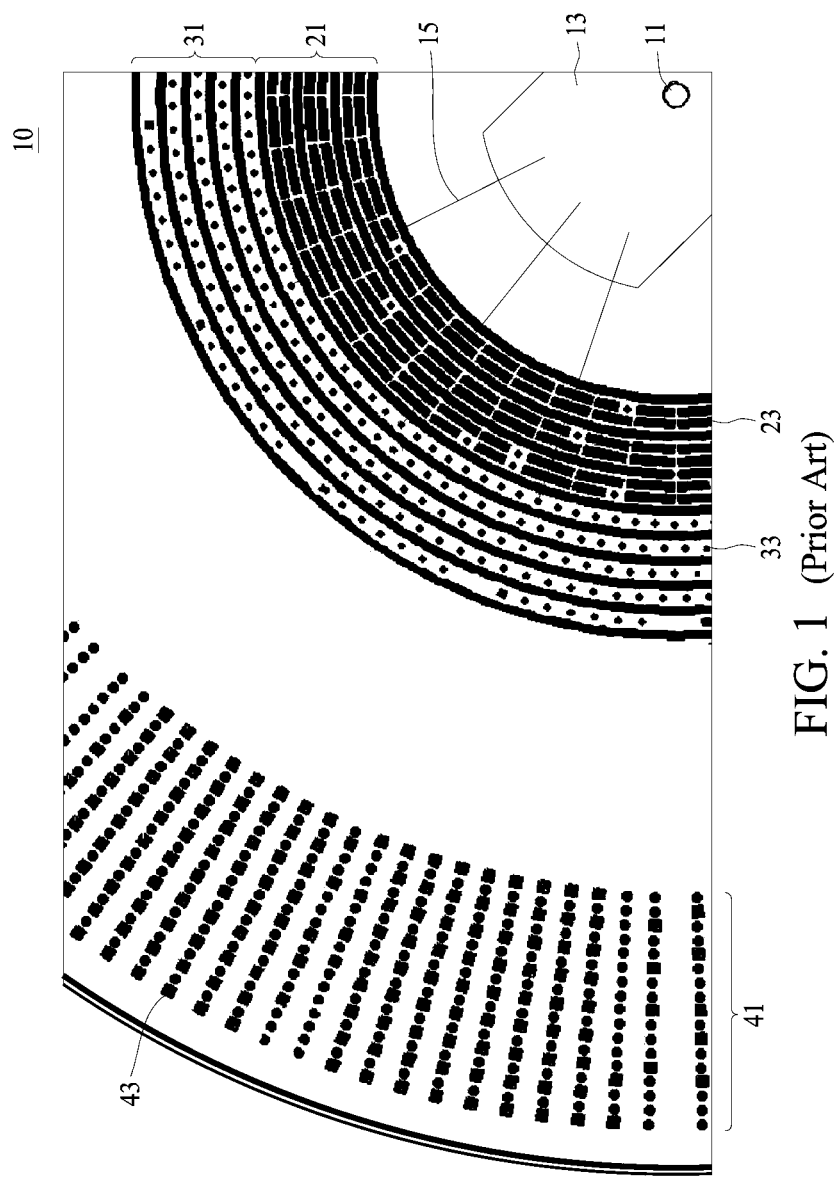
FIG. 1 illustrates a top view of a conventional probe card.
Figure 2:
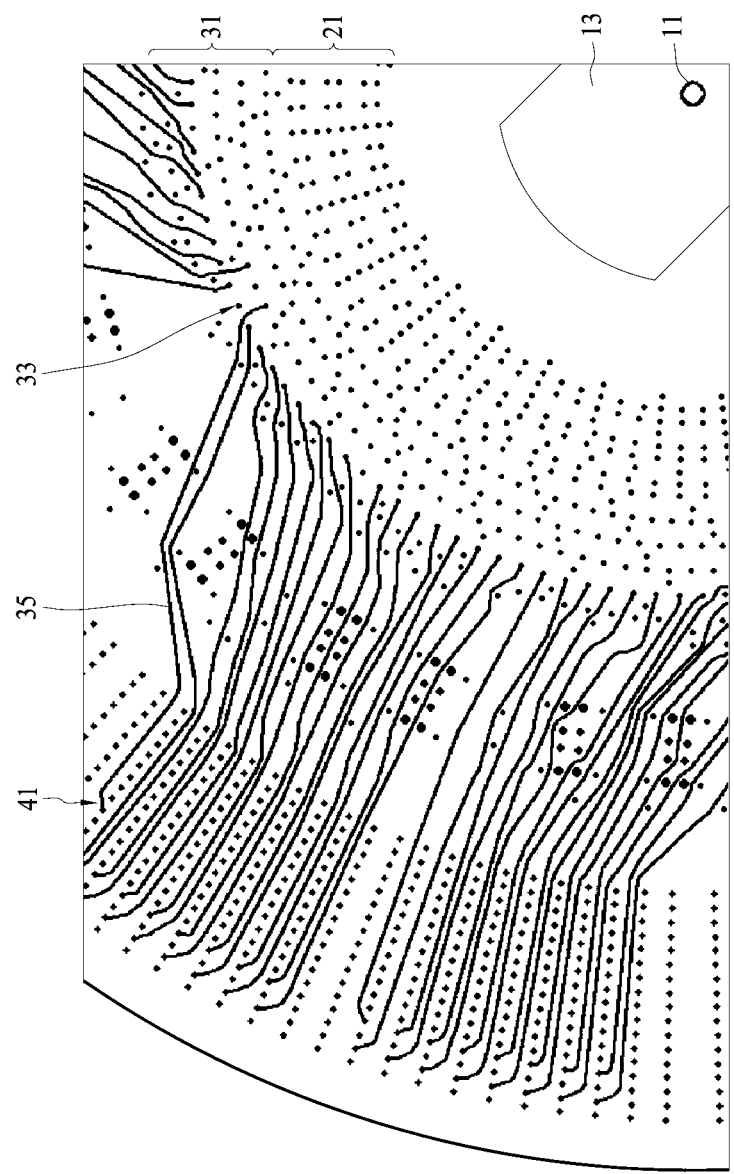
FIG. 2 illustrates the inner traces of the probe card shown in FIG. 1.
Figure 3:
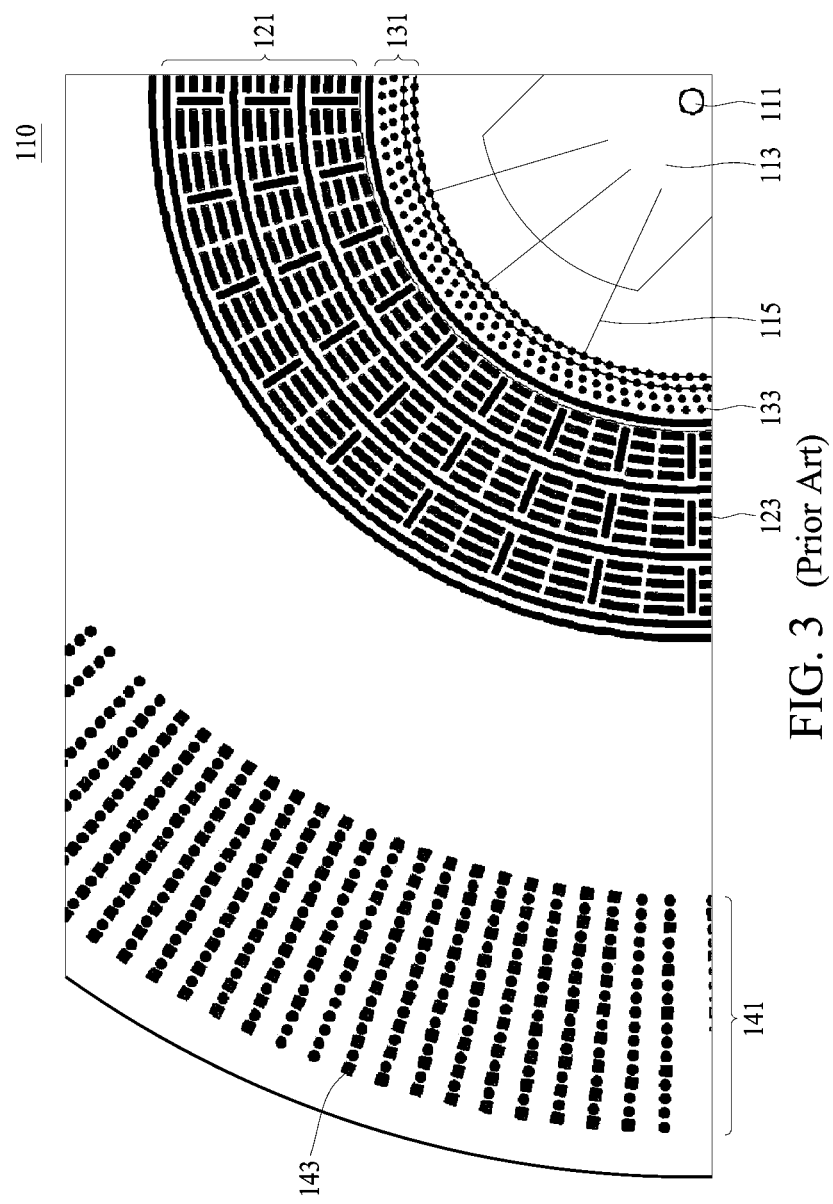
FIG. 3 illustrates a top view of a conventional probe card.
Figure 4:
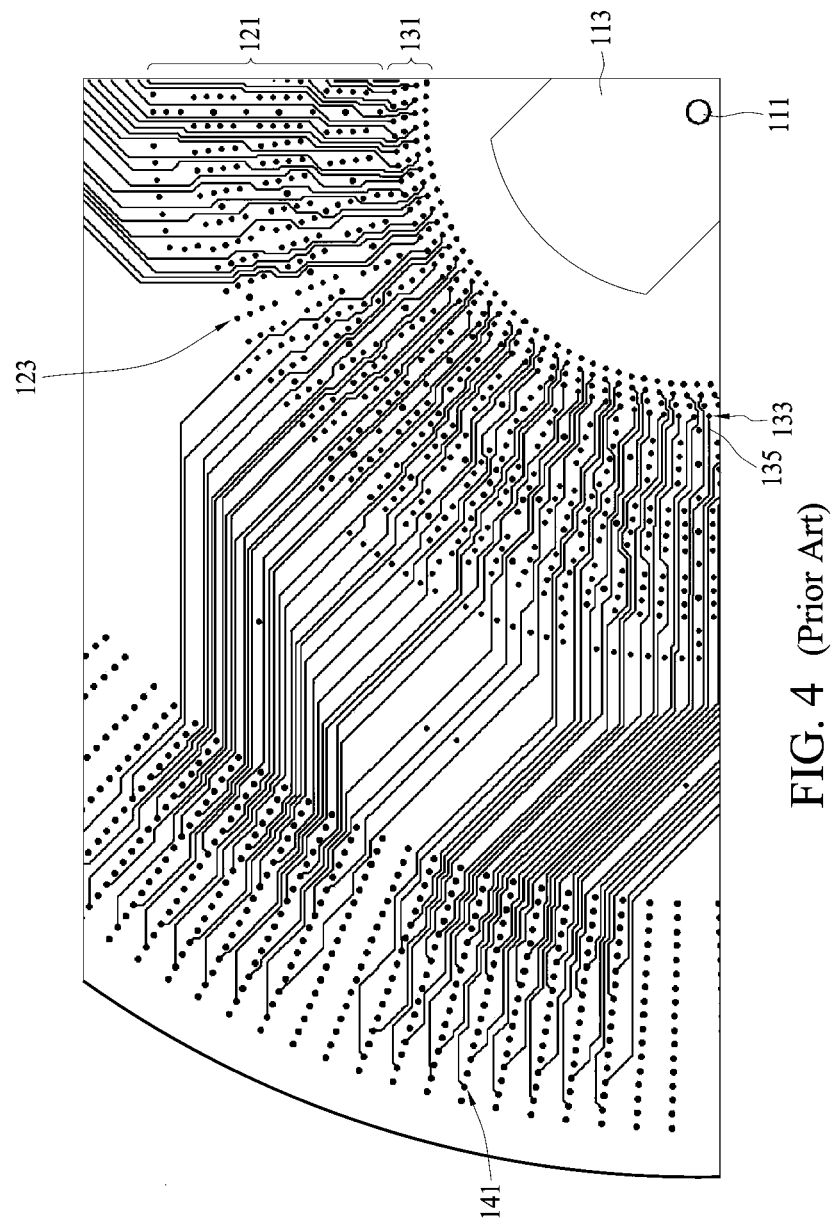
FIG. 4 illustrates the inner traces of the probe card shown in FIG. 3.
Figure 5:
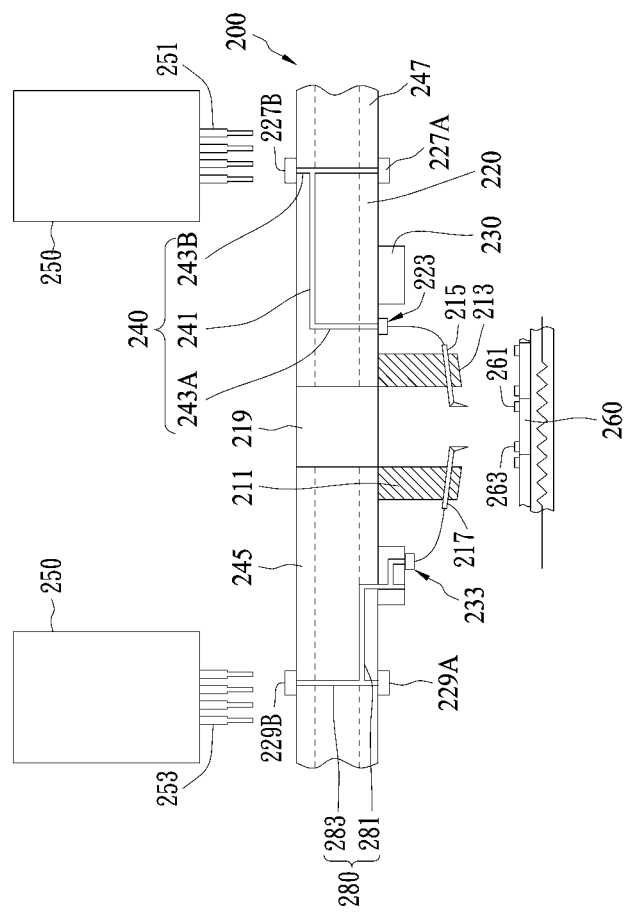
FIG. 5 is a sectional view of a probing apparatus according to one embodiment of the present invention.
Figure 6:
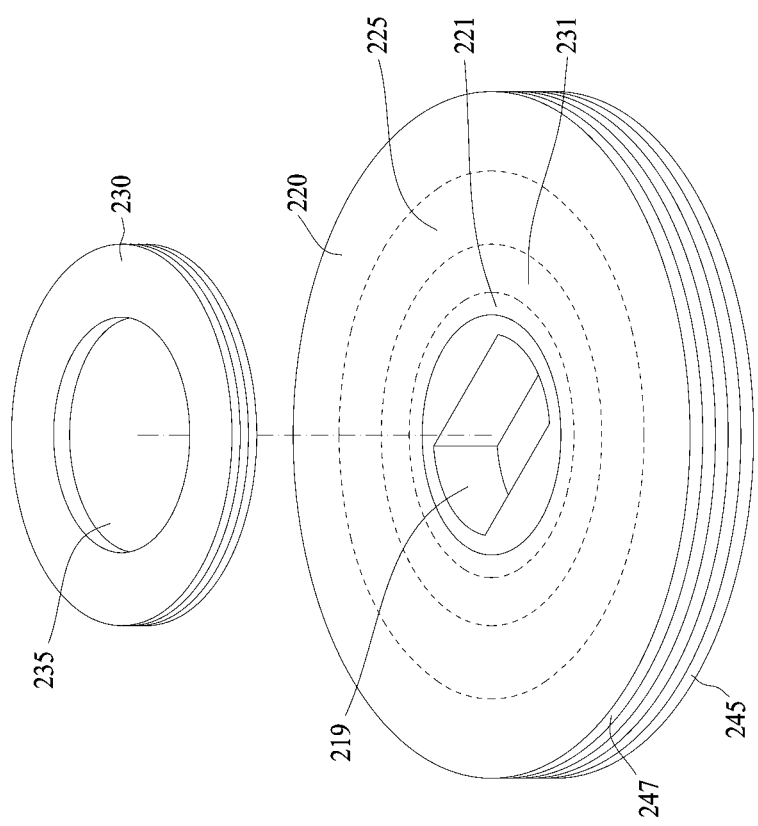
FIG. 6 is a schematic disassembled view of the probing apparatus according to one embodiment of the present invention.

FIG. 5 is a sectional view of a probing apparatus 200 according to one embodiment of the present invention and FIG. 6 is a schematic disassembled view of the probing apparatus 200 according to one embodiment of the present invention. In one embodiment of the present invention, the probing apparatus 200 comprises a primary circuit board 220 and a power board 230, at least one signal probe 215, and at least one power probe 217. In one embodiment of the present invention, the primary circuit board 220 includes a supporter 211, and the signal probe 215 and the second probe 217 are positioned on the supporter 211 by epoxy resin 213. In one embodiment of the present invention, the primary circuit board 220 includes a first layer 245 and a second layer 247.

In one embodiment of the present invention, the signal probe 215 has a first tip configured to contact a first portion (pad) 261 of a device under test 260 and a first distal end electrically connected to one of the first contacts 223 on the primary circuit board 220 via wires. In one embodiment of the present invention, the second probe 217 has a second tip configured to contact a second portion (pad) 263 of the device under test 260 and a second distal end electrically connected to one of the second contacts 233 on the power board 230.

Figure 7:
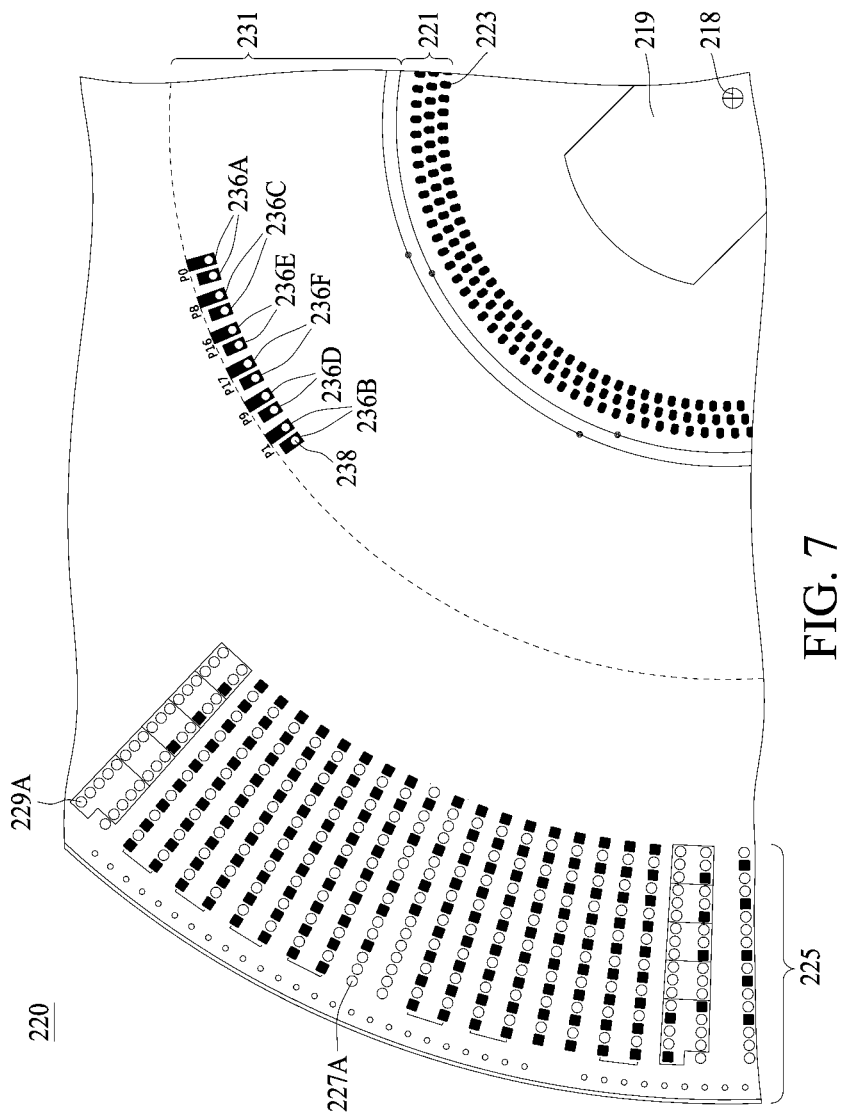
FIG. 7 is a close-up bottom view of the primary circuit board according to one embodiment of the present invention.
Figure 8:
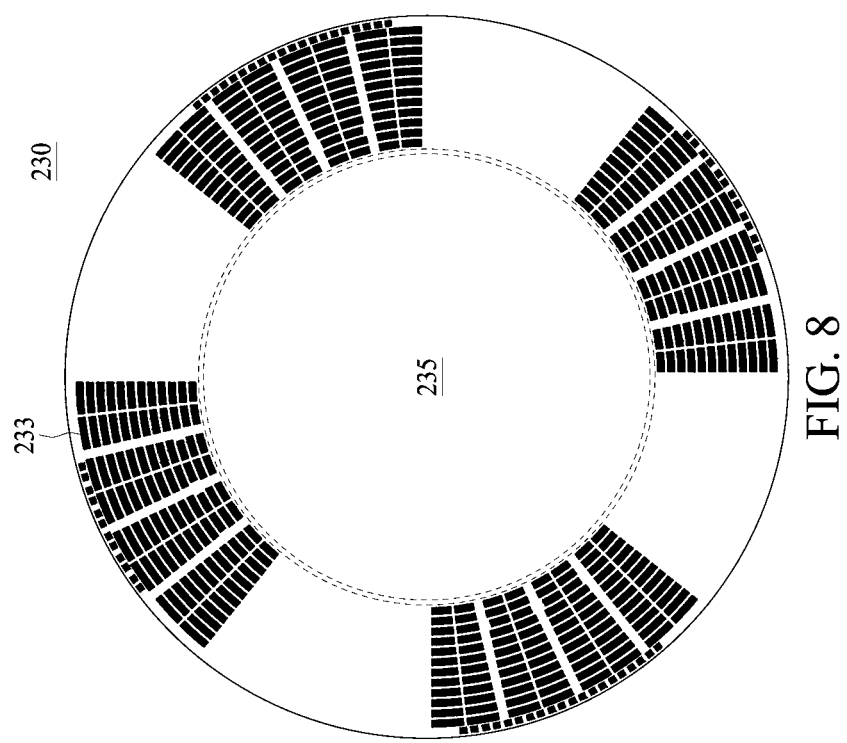
FIG. 8 is a bottom view of the power board according to one embodiment of the present invention.

FIG. 7 is a close-up bottom view of the primary circuit board 220 according to one embodiment of the present invention and FIG. 8 is a bottom view of the power board 230 according to one embodiment of the present invention. In one embodiment of the present invention, the primary circuit board 220 includes an inner area 221 having a plurality of first contacts (for example, signal contacts) 223, an outer area 225 having a plurality of first terminals (for example, signal terminals) 227A and second terminals (for example, power terminals) 229A, and an intermediate area 231 between the outer area 225 and the inner area 221, wherein the power board 230 is positioned on the intermediate area 231 without covering the inner area 221.

Referring to FIG. 8, in one embodiment of the present invention, the power board 230 has a plurality of second contacts (for example, power contacts) 233 positioned on the primary circuit board 220. In one embodiment of the present invention, the primary circuit board 220 includes an opening 219 substantially positioned at the center of the primary circuit board 220, and the inner area 221 is between the opening 219 and the outer area 225. In one embodiment of the present invention, the power board 230 is circular and includes a central circular aperture 235 exposing the inner area 221 of the primary circuit board 220.

Figure 9:
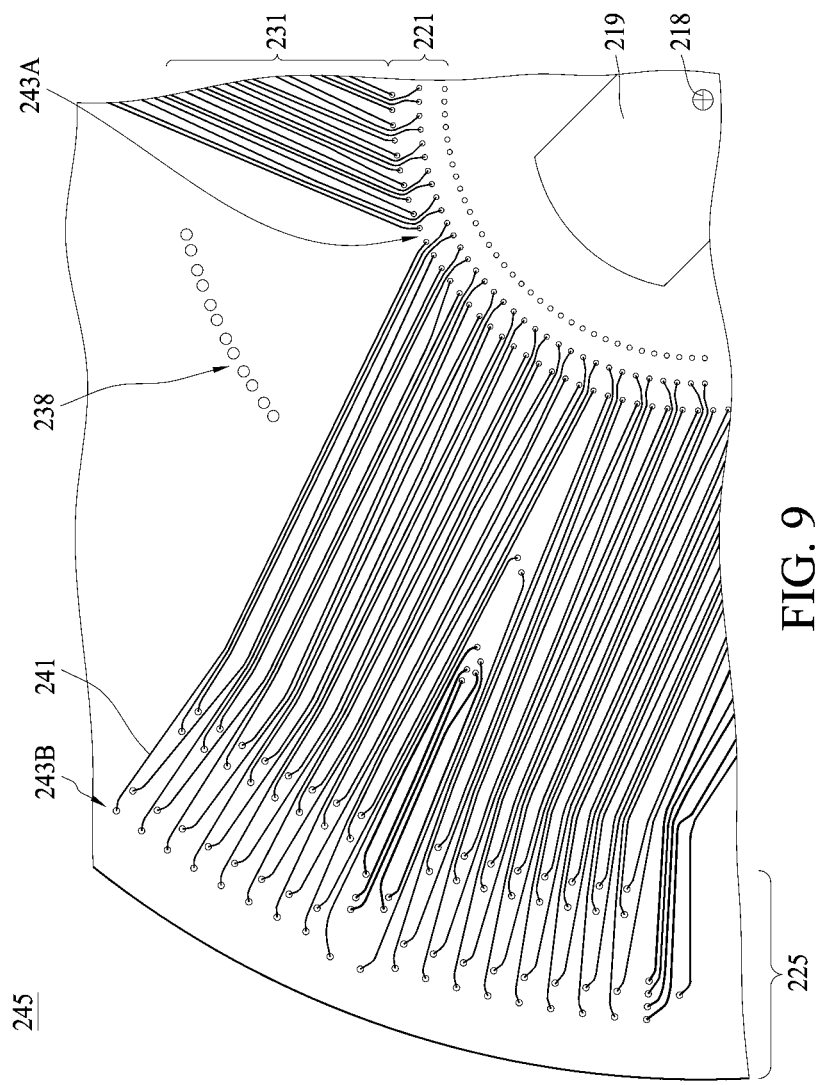
FIG. 9 illustrates the layout of the first layer of the primary circuit board for transmitting signals according to one embodiment of the present invention.

FIG. 9 illustrates the layout of the first layer 245 of the primary circuit board 220 according to one embodiment of the present invention. Referring to FIG. 5 and FIG. 9, in one embodiment of the present invention, the first contacts 223 are electrically connected to the first terminals 227A via first conductive members 240 in the primary circuit board 220, and the first conductive members 240 include conductive traces 241 and conductive through holes 243A, 243B. In particular, the conductive through hole 243B also electrically connects the first terminals 227A on the bottom side to the test pad 227B on the top side of the primary circuit board 220, and a test head 250 of a tester includes a plurality of signal pins 251 that can form electrical connection with the signal probe 215 by contacting the test pad 227B on the top side of the primary circuit board 220.

Figure 10:
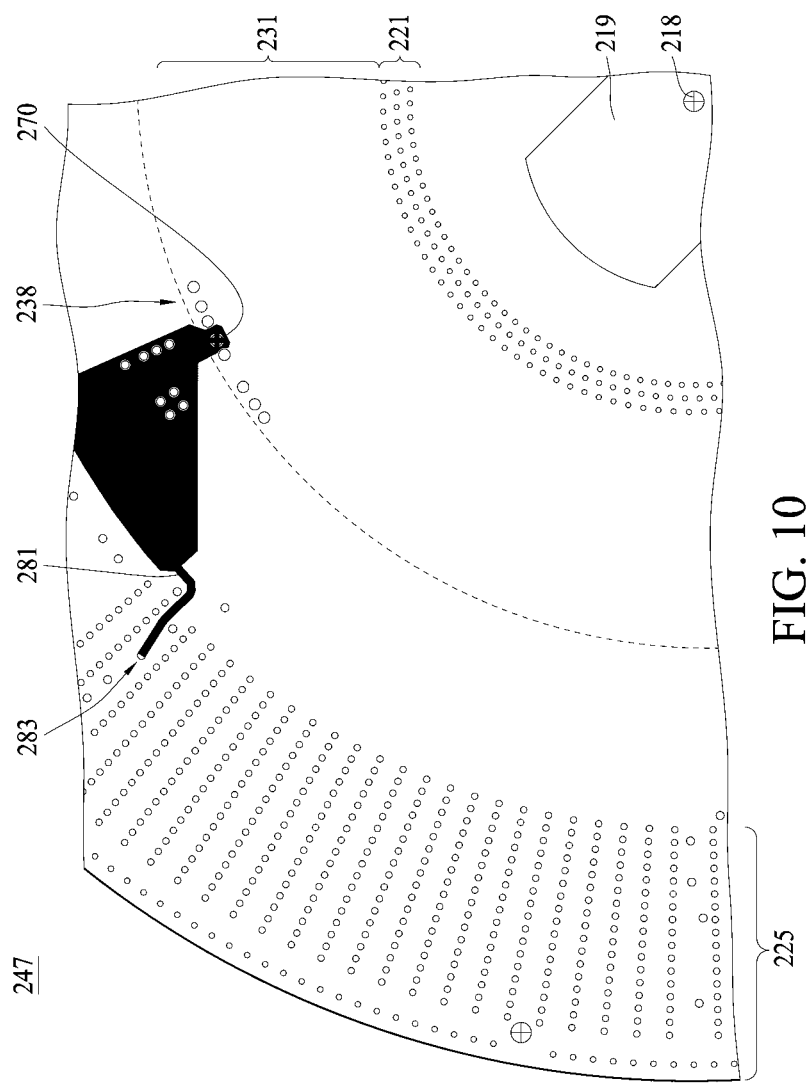
FIG. 10 illustrates the layout of the second layer of the primary circuit board for transmitting power according to one embodiment of the present invention.

FIG. 10 illustrates the layout of the second layer 247 of the primary circuit board 220 according to one embodiment of the present invention. Referring to FIG. 5 and FIG. 10, in one embodiment of the present invention, the second contacts 233 are electrically connected to the second terminals 229A via power traces 280 in the primary circuit board 220 and connectors 270 connecting the primary circuit board 220 and the power board 230. In one embodiment of the present invention, the power traces 280 include power lines 281 and conductive through holes 283. In particular, the conductive through hole 283 also electrically connects the second terminals 229A on the bottom side to the test pad 229B on the top side of the primary circuit board 220, and the test head 250 including a plurality of power pins 253 can form electrical connections with the second probe 217 by contacting the test pad 229B on the top side of the primary circuit board 220.

Figure 11:
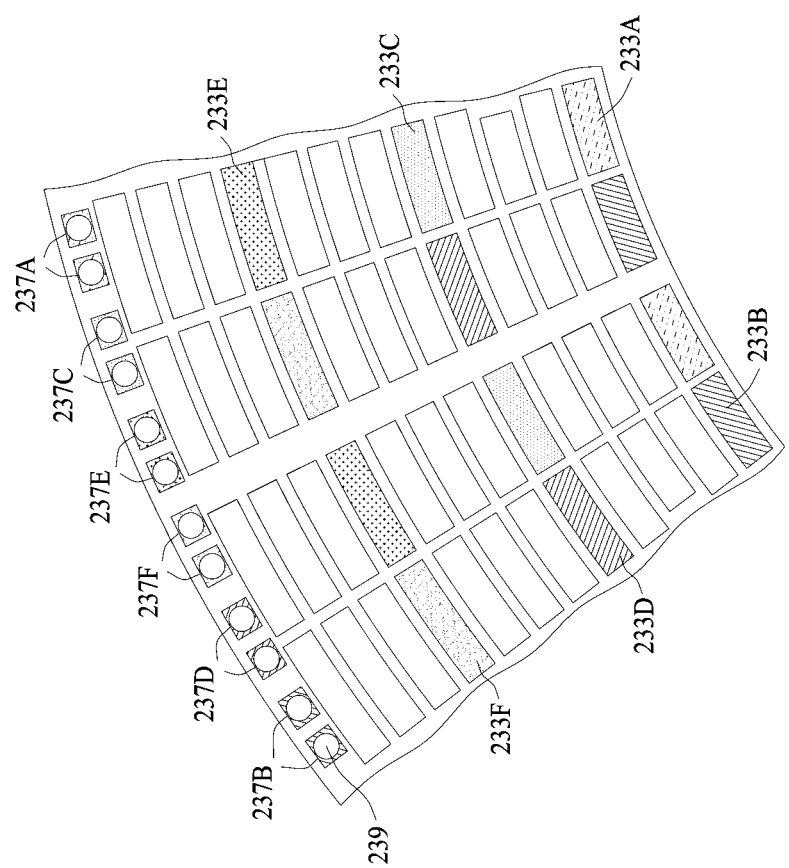
FIG. 11 is a close-up view of the power board according to one embodiment of the present invention.

FIG. 11 is a close-up view of the power board 230 according to one embodiment of the present invention. In one embodiment of the present invention, the second contacts 233 of the power board 230 are grouped into a plurality of contact groups 233A to 233F, the power board 230 further includes a plurality of connecting sites 237A to 237F with conductive through holes 239, and one of the connecting sites 237A to 237F is electrically connected to the second contacts 233 of a respective group by the conductive members in the power board 230. For example, the connecting site 237A is electrically connected to the second contacts 233 of the group 233A, and so on. In one embodiment of the present invention, the connecting sites 237A to 237F are positioned at a peripheral area of the power board 220.

Figure 12:
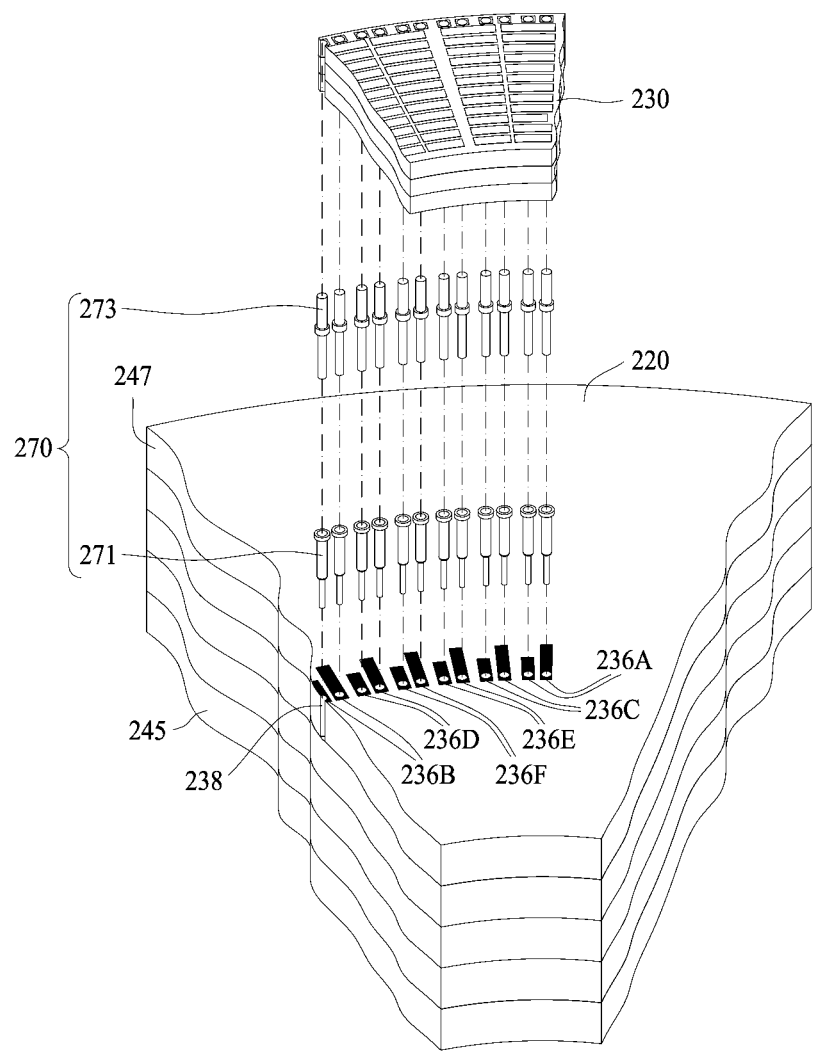
FIG. 12 is a schematic disassembled view of the primary circuit board and the power board according to one embodiment of the present invention.

FIG. 12 is a schematic disassembled view of the primary circuit board 220 and the power board 230 according to one embodiment of the present invention. In one embodiment of the present invention, the primary circuit board 220 includes a plurality of connecting sites 236A to 236F with conductive through holes 238, and the positions of the connecting sites 236A to 236F correspond to those of the connecting sites 237A to 237F of the power board 230. In one embodiment of the present invention, the power board 230 is fixed on the primary circuit board 220 by the connectors 270. In one embodiment of the present invention, each of the connectors 270 includes a socket portion 271 positioned on the primary circuit board 220 and a plug portion 273 configured to be inserted into the socket portion 271 with the power board 230 sandwiched between the socket portion 271 and the plug portion 273.

Referring back to FIG. 5 and FIG. 7, because the power contact 233 and the signal contact 223 are positioned on different circuit boards 230 and 220, respectively, the signal probe 215 connects the signal contacts 223 in the inner area 221 without spanning the intermediate area 231 where the power board 230 is located, and the signal loss problem caused by the spanning of the probe can be substantially solved.

Referring back to FIG. 9, because the power contact 233 and the signal contact 223 are positioned on different circuit boards 230 and 220, respectively, the conductive through holes 238 for transmitting power are concentrated in a predetermined area on the primary circuit board 22, the internal traces 241 for transmitting signals can be more easily designed without concern for the position of the conductive through holes 238 for transmitting power, and the internal traces 241 for transmitting signals can be substantially linear without turns to bypass the power contacts 233. Consequently, the internal traces 241 carrying the signals are not close to the conductive through holes 238 for transmitting power, and the voltage of the conductive through holes 238 for transmitting power may not influence the signals on the internal traces 241, i.e., signal disturbance is eliminated.

Figure 13:
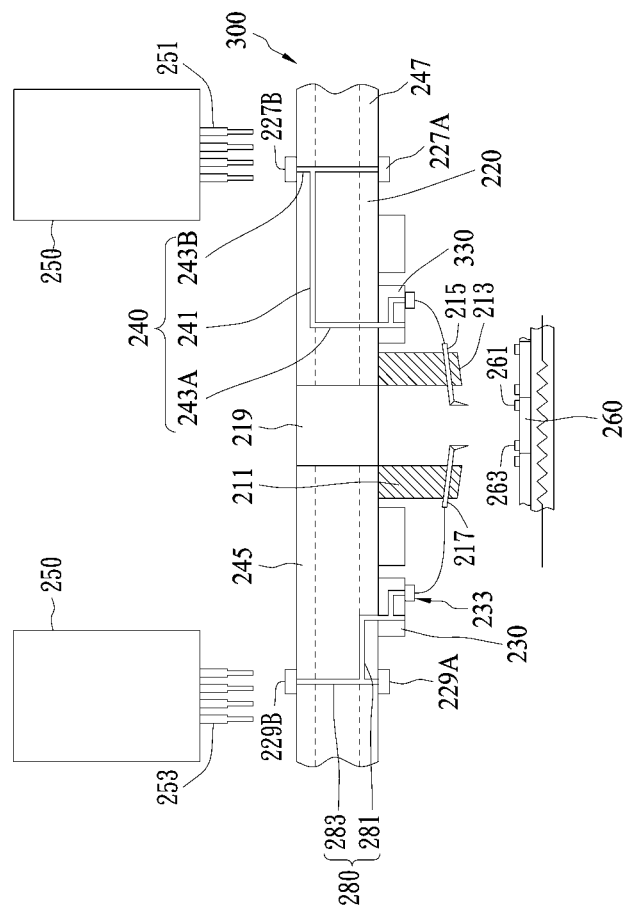
FIG. 13 is a sectional view of a probing apparatus according to one embodiment of the present invention.
Figure 14:
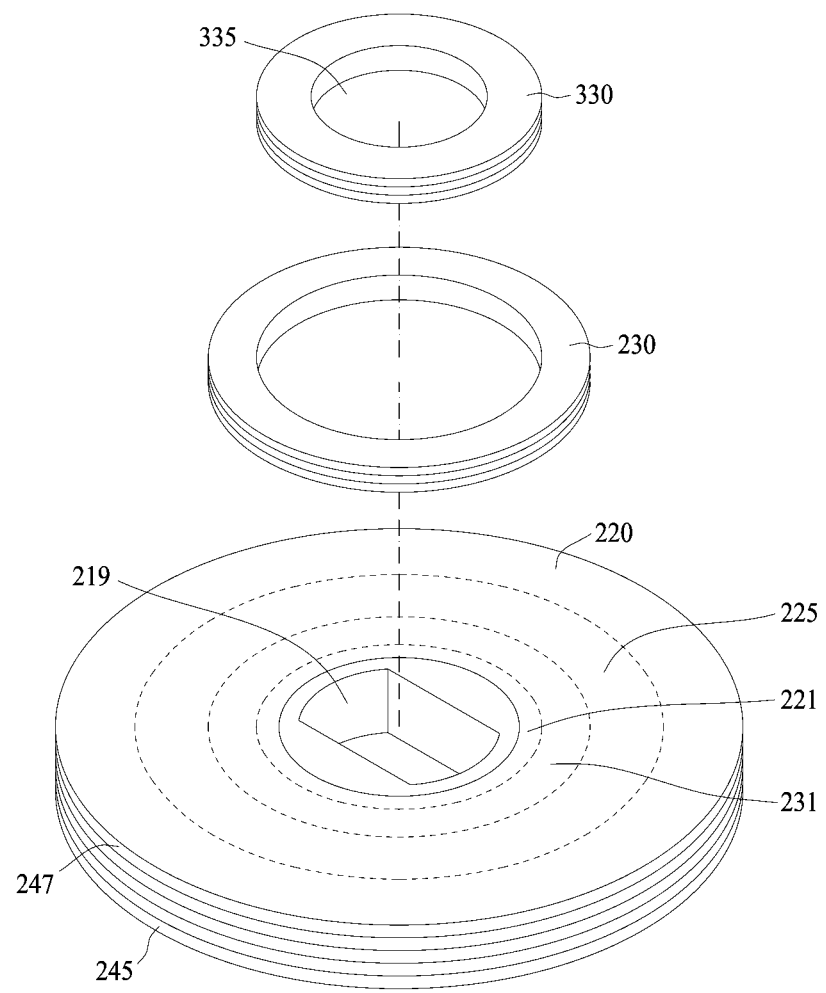
FIG. 14 is a schematic disassembled view of the probing apparatus according to one embodiment of the present invention.

FIG. 13 is a sectional view of a probing apparatus 300 according to one embodiment of the present invention and FIG. 14 is a schematic disassembled view of the probing apparatus 300 according to one embodiment of the present invention. In one embodiment of the present invention, the probing apparatus 300 comprises a primary circuit board 220 and a signal-adapting board 330, at least one signal probe 215, and at least one power probe 217. In one embodiment of the present invention, the primary circuit board 220 includes a supporter 211, and the signal probe 215 and the second probe 217 are positioned on the supporter 211 by epoxy resin 213.

In one embodiment of the present invention, the signal probe 215 has a first tip configured to contact a first portion (pad) 261 of a device under test 260 and a first distal end electrically connected to one of the first contacts 323 on the primary circuit board 220 via the signal-adapting board 330. In one embodiment of the present invention, the second probe 217 has a second tip configured to contact a second portion (pad) 263 of the device under test 260 and a second distal end electrically connected to one of the second contacts 233 on the signal-adapting board 330.

Figure 15:
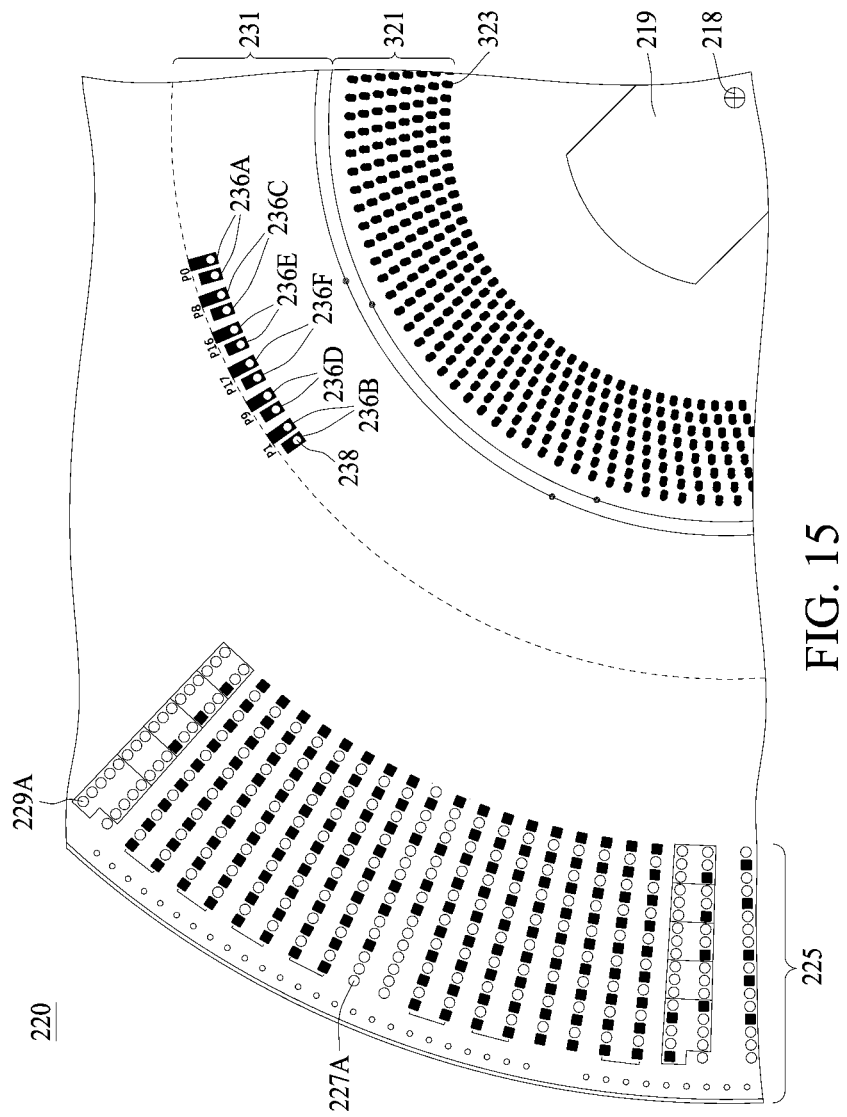
FIG. 15 is a close-up bottom view of the primary circuit board according to one embodiment of the present invention.
Figure 16:
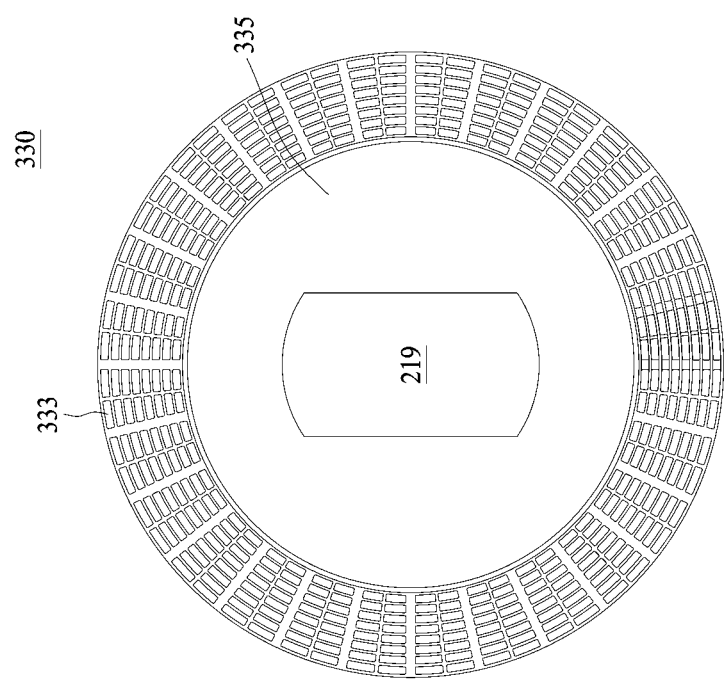
FIG. 16 is a bottom view of the signal-adapting board according to one embodiment of the present invention

FIG. 15 is a close-up bottom view of the primary circuit board 220 according to one embodiment of the present invention and FIG. 16 is a bottom view of the signal-adapting board 330 according to one embodiment of the present invention. In one embodiment of the present invention, the primary circuit board 220 includes an inner area 321 having a plurality of first contacts (for example, signal contacts) 323, an outer area 225 having a plurality of first terminals (for example, signal terminals) 227A and second terminals (for example, power terminals) 229A, and an intermediate area 231 between the outer area 225 and the inner area 221, wherein the signal-adapting board 330 is positioned on the inner area 321 without covering the outer area 225 and the intermediate area 231.

In one embodiment of the present invention, the first contacts 323 are arranged in a ring-shaped manner, and each of the first contacts 323 is electrically connected to a respective first terminals 227A. In one embodiment of the present invention, the first contacts 323 are arranged in a plurality of rings; for example, in eight rings.

Referring to FIG. 16, in one embodiment of the present invention, the signal-adapting board 330 has a plurality of second contacts (for example, power contacts) 333 positioned on the primary circuit board 220. In one embodiment of the present invention, the primary circuit board 220 includes an opening 219 substantially positioned at the center of the primary circuit board 220, and the inner area 221 is between the opening 219 and the outer area 225. In one embodiment of the present invention, the signal-adapting board 330 is circular and includes a central circular aperture exposing the opening 219.

Figure 17:
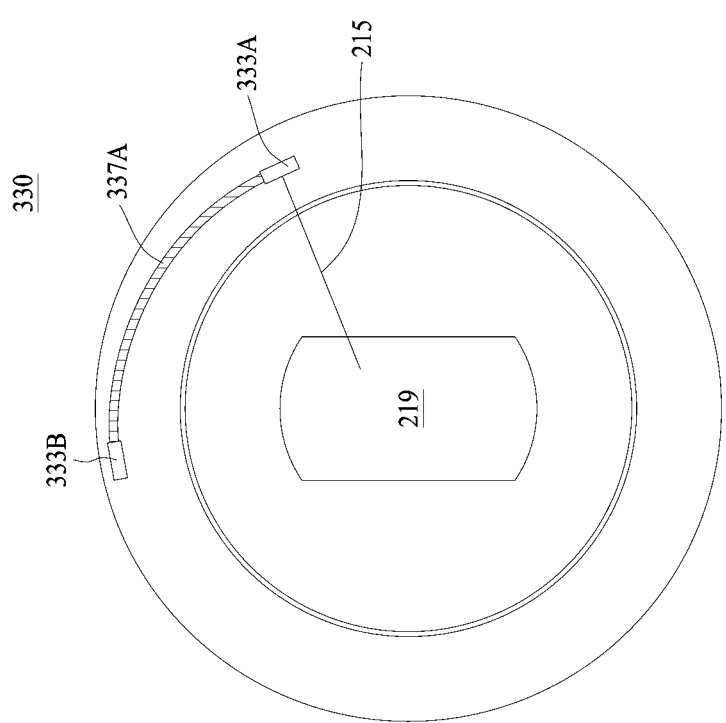
FIG. 17 illustrates the function of the signal-adapting board according to one embodiment of the present invention.

FIG. 17 illustrates the function of the signal-adapting board 330 according to one embodiment of the present invention. In one embodiment of the present invention, the signal-adapting board 330 includes a contact 333A and a contact 333B, and the contact 333B is electrically connected to one of the first contacts 323 on the primary circuit board 220. In one embodiment of the present invention, the signal-adapting board 330 includes second conductive members having a lateral portion 337A, which electrically connects the contact 333A to the contact 333B, and the signal probe 215 electrically connects the contact 333A.

Referring back to FIG. 15, the connection between the first contacts 323 and the signal terminals 227A is fixed after the primary circuit board 220 is completed. The signal probe 215 is designed to contact a predetermined first contacts 323 on the primary circuit board 220 so as to form electrically connection with a predetermined signal terminals 227A. Without using the signal-adapting board 330, the distal end of the signal probe 215 must directly contact the predetermined first contacts 323 electrically connected to the predetermined signal terminals 227A, i.e., the position arrangement of the signal probe 215 is restricted to the fixed electrical connection of the first contacts 323 to the signal terminals 227A on the primary circuit board 220.

Referring back to FIG. 17, with using the signal-adapting board 330, the designer of the probing apparatus 300 can arrange the signal probe 215 more flexibly without concerning the fixed electrical connection of the first contacts 323 to the signal terminals 227A on the primary circuit board 220. For example, in case that the signal probe 215 is designed to form electrically connection with the predetermined signal terminals 227A electrically connected to the predetermined first contacts 323, the designer does not have to arrange the signal probe 215 to directly contact the contact the predetermined first contacts 323; instead, the designer can position the signal probe 215 to directly contact the contact 333A and uses the lateral portion 337A to electrically connect the contact 333A and the contact 333B, whose position corresponds to the position of the predetermined first contacts 323 so as to form electrical connection with the predetermined first contacts 323.

FIG. 18 illustrates the function of the signal-adapting board 330' according to one embodiment of the present invention. In case that the signal probe 215 is designed to form electrically connection with another signal terminals 227A, the designer does not need to rearrange the signal probe 215 or to change the primary circuit board 220; instead, the designer only have to use another signal-adapting board 330' having a lateral portion 337B electrically connecting the contact 333A to the contact 333C, whose position corresponds to the position of one of the first contacts 323 electrically connected to the desired signal terminals 227A. In other words, the primary circuit board 220 can be commonly used for different arrangements of probes by using the signal-adapting board 330'.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A probing apparatus for semiconductor devices, comprising:
    a primary circuit board including an inner area having a plurality of first contacts and an outer area having a plurality of first terminals and second terminals, the first contacts being electrically connected to the first terminals via first conductive members in the primary circuit board;
    a signal-adapting board positioned on the primary circuit board, the signal-adapting board having a plurality of second contacts electrically connected to the first contacts via second conductive members in the signal-adapting board; and
    a power board positioned on the primary circuit board without covering the inner area and the outer area, and the power board has a plurality of power contacts electrically connected to the second terminals via power traces in the primary circuit board,
    wherein the power contacts are grouped into a plurality of contact groups, the power board further includes a plurality of first connecting sites, and one of the first connecting sites is electrically connected to the power contacts of the same group.

2. The probing apparatus for semiconductor devices of claim 1, wherein the first contacts are arranged in a ring-shaped manner.

3. The probing apparatus for semiconductor devices of claim 2, wherein the first contacts are arranged in a plurality of rings.

4. The probing apparatus for semiconductor devices of claim 1, wherein the second conductive members comprises a lateral portion configured to electrically connect one of the second contacts to one of first contacts.

5. The probing apparatus for semiconductor devices of claim 1, wherein the primary circuit board includes an opening substantially positioned at the center of the primary circuit board, and the signal-adapting board is circular and includes a central circular aperture exposing the opening.

6. The probing apparatus for semiconductor devices of claim 1, wherein the signal-adapting board is positioned on the inner area without covering the outer area.

7. The probing apparatus for semiconductor devices of claim 1, further comprising at least one power probe having a first tip configured to contact a first portion of a device under test and a second distal end electrically connected to one of the power contacts on the power board.

8. The probing apparatus for semiconductor devices of claim 1, wherein the power board is positioned in an intermediate area between the outer area and the inner area of the primary circuit board.

9. The probing apparatus for semiconductor devices of claim 1, wherein the power board is circular and includes a central circular aperture exposing the inner area of the primary circuit board.

10. The probing apparatus for semiconductor devices of claim 7, further comprising at least one signal probe having a second tip configured to contact a second portion of the device under test and a second distal end electrically connected to one of the first contacts on the primary circuit board.

11. The probing apparatus for semiconductor devices of claim 1, wherein the primary circuit board includes a plurality of second connecting sites, and the positions of the second connecting sites correspond to those of the first connecting sites.

12. The probing apparatus for semiconductor devices of claim 1, wherein the first connecting sites are positioned at a peripheral area of the power board.

13. The probing apparatus for semiconductor devices of claim 12, further comprising at least one connector configured to connect the primary circuit board and the power board.

14. The probing apparatus for semiconductor devices of claim 13, wherein the connector includes a socket portion positioned on the primary circuit board and a plug portion inserted in the socket portion with the power board between the socket portion and the plug portion.

15. A probing apparatus for semiconductor devices, comprising:
 a primary circuit board including an inner area having a plurality of first contacts and an outer area having a plurality of first terminals and second terminals, the first contacts being electrically connected to the first terminals via first conductive members in the primary circuit board; and
 a power board positioned on the primary circuit board without covering the inner area, the power board having a plurality of second contacts electrically connected to the second terminals via at least second conductive members in the primary circuit board,
 wherein the second contacts are grouped into a plurality of contact groups, the power board further includes a plurality of first connecting sites, and one of the first connecting sites is electrically connected to the second contacts of the same group.

16. The probing apparatus for semiconductor devices of claim 15, further comprising at least one connector configured to connect the primary circuit board and the power board.

17. The probing apparatus for semiconductor devices of claim 16, wherein the connector includes a socket portion positioned on the primary circuit board and a plug portion inserted in the socket portion with the power board between the socket portion and the plug portion.

18. The probing apparatus for semiconductor devices of claim 15, wherein the power board is positioned on an intermediate area between the outer area and the inner area.

19. The probing apparatus for semiconductor devices of claim 15, wherein the primary circuit board includes a first layer and a second layer, the first conductive members include first traces positioned in the first layer, and the second conductive members include second traces positioned in the second layer.

20. The probing apparatus for semiconductor devices of claim 15, wherein the first contacts are signal contacts and the first terminals are signal terminals, and the second contacts are power contacts and the second terminals are power terminals.

21. The probing apparatus for semiconductor devices of claim 15, wherein the primary circuit board includes an opening substantially positioned at the center of the primary circuit board, and the inner area is between the opening and the outer area.

22. The probing apparatus for semiconductor devices of claim 15, wherein the power board is circular and includes a central circular aperture exposing the inner area of the primary circuit board.

23. The probing apparatus for semiconductor devices of claim 15, further comprising at least one power probe having a first tip configured to contact a first portion of a device under test and a first distal end electrically connected to one of the second contacts on the power board.

24. The probing apparatus for semiconductor devices of claim 15, wherein the primary circuit board includes a plurality of second connecting sites, and the positions of the second connecting sites correspond to those of the first connecting sites.

25. The probing apparatus for semiconductor devices of claim 15, wherein the first connecting sites are positioned at a peripheral area of the power board.

26. The probing apparatus for semiconductor devices of claim 23, further comprising at least one signal probe having a second tip configured to contact a second portion of the device under test and a second distal end electrically connected to one of the first contacts on the primary circuit board.

\* \* \* \* \*